United States Patent
Larson, III

(10) Patent No.: US 7,425,787 B2
(45) Date of Patent: Sep. 16, 2008

(54) ACOUSTIC GALVANIC ISOLATOR INCORPORATING SINGLE INSULATED DECOUPLED STACKED BULK ACOUSTIC RESONATOR WITH ACOUSTICALLY-RESONANT ELECTRICAL INSULATOR

(75) Inventor: John D Larson, III, Palo Alto, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/253,508

(22) Filed: Oct. 18, 2005

(65) Prior Publication Data

US 2007/0085447 A1 Apr. 19, 2007

(51) Int. Cl.
*H01L 41/04* (2006.01)
*H01L 41/107* (2006.01)

(52) U.S. Cl. .................. 310/311; 310/326; 310/327
(58) Field of Classification Search .............. 310/311, 310/320, 324, 326, 327
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,640,756 A | 2/1987 | Wang et al. |
| 4,719,383 A | 1/1988 | Wang et al. |

(Continued)

FOREIGN PATENT DOCUMENTS

DE 10160617 6/2003

(Continued)

OTHER PUBLICATIONS

U.S. Appl. No. 10/971,169, filed Oct. 22, 2004, John D. Larson, III et al.

(Continued)

*Primary Examiner*—Darren Schuberg
*Assistant Examiner*—Derek J Rosenau

(57) ABSTRACT

Embodiments of the acoustic galvanic isolator comprise a carrier signal source, a modulator connected to receive an information signal and the carrier signal, a demodulator, and an electrically-isolating acoustic coupler connected between the modulator and the demodulator. The acoustic coupler comprises no more than one decoupled stacked bulk acoustic resonator (IDSBAR). An electrically-isolating acoustic coupler based on a single IDSBAR is physically small and is inexpensive to fabricate yet is capable of passing information signals having data rates in excess of 100 Mbit/s and has a substantial breakdown voltage between its inputs and its outputs.

22 Claims, 4 Drawing Sheets

U.S. PATENT DOCUMENTS

| | | | |
|---|---|---|---|
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,075,641 A | 12/1991 | Weber et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,705,877 A | 1/1998 | Shimada | |
| 5,714,917 A | 2/1998 | Ella | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A * | 8/1999 | Kobrin et al. | 73/24.06 |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,265,246 B1 | 7/2001 | Ruby et al. | |
| 6,278,342 B1 | 8/2001 | Ella | |
| 6,292,336 B1 | 9/2001 | Horng | |
| 3,607,761 A1 | 10/2001 | Nakagawa | |
| 6,307,447 B1 | 10/2001 | Barber et al. | |
| 6,366,006 B1 | 4/2002 | Boyd | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Ylilammi et al. | |
| 6,486,751 B1 | 11/2002 | Barber et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 * | 12/2003 | Ella et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada | |
| 6,911,708 B2 | 6/2005 | Park | |
| 6,917,261 B2 * | 7/2005 | Unterberger | 333/189 |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson et al. | |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |
| 6,985,052 B2 | 1/2006 | Tikka | |
| 6,987,433 B2 | 1/2006 | Larson et al. | |
| 6,989,723 B2 | 1/2006 | Komuro et al. | |
| 6,998,940 B2 | 2/2006 | Metzger | |
| 7,019,604 B2 | 3/2006 | Gotoh et al. | |
| 7,019,605 B2 | 3/2006 | Larson et al. | |

| | | | | | | |
|---|---|---|---|---|---|---|
| 7,057,476 | B2 | 6/2006 | Hwu | EP | 1100196 | 2/2002 |
| 7,084,553 | B2 | 8/2006 | Ludwiczak | EP | 1258990 | 11/2002 |
| 7,091,649 | B2 | 8/2006 | Larson | EP | 1180494 | 3/2003 |
| 7,098,758 | B2 | 8/2006 | Wang et al. | EP | 1542362 | 6/2003 |
| 7,170,215 | B2 | 1/2007 | Namba et al. | EP | 1258989 | 1/2004 |
| 7,173,504 | B2 | 2/2007 | Larson | EP | 1528674 | 6/2004 |
| 7,187,254 | B2 | 3/2007 | Su et al. | EP | 1528675 | 6/2004 |
| 7,230,509 | B2 | 6/2007 | Stoemmer | EP | 1528677 | 7/2004 |
| 2002/0000646 | A1 | 1/2002 | Gooch et al. | EP | 1249932 | 3/2005 |
| 2002/0030424 | A1 | 3/2002 | Iwata | EP | 1517443 | 3/2005 |
| 2002/0121944 | A1 | 9/2002 | Larson, III et al. | EP | 1517444 | 3/2005 |
| 2002/0121945 | A1 | 9/2002 | Ruby et al. | EP | 1557945 | 7/2005 |
| 2002/0152803 | A1 | 10/2002 | Larson, III et al. | EP | 1575165 | 9/2005 |
| 2002/0190814 | A1 | 12/2002 | Yamada et al. | GB | 1 207 974 | 11/1967 |
| 2003/0001251 | A1 | 1/2003 | Cheever et al. | GB | 2411239 | 8/2005 |
| 2003/0006502 | A1 | 1/2003 | Karpman | GB | 2418791 | 4/2006 |
| 2003/0051550 | A1 | 3/2003 | Nguyen et al. | JP | 61054686 | 3/1986 |
| 2003/0087469 | A1 | 5/2003 | Ma | JP | 2002217676 | 8/2002 |
| 2003/0102776 | A1 | 6/2003 | Takeda et al. | WO | WO 98/16957 | 4/1998 |
| 2003/0111439 | A1 | 6/2003 | Fetter et al. | WO | WO-9816957 | 4/1998 |
| 2003/0128081 | A1 | 7/2003 | Ella et al. | WO | WO-01/06647 | 1/2001 |
| 2003/0132493 | A1 | 7/2003 | Kang et al. | WO | WO-01/99276 | 12/2001 |
| 2003/0141946 | A1 | 7/2003 | Ruby et al. | WO | WO-02/103900 | 12/2002 |
| 2003/0179053 | A1 | 9/2003 | Aigner et al. | WO | WO-03/030358 | 4/2003 |
| 2004/0092234 | A1 | 5/2004 | Pohjonen | WO | WO-03/043188 | 5/2003 |
| 2004/0124952 | A1 | 7/2004 | Tikka | WO | WO 03/050950 | 6/2003 |
| 2004/0150293 | A1 | 8/2004 | Unterberger | WO | WO-2003/058809 | 7/2003 |
| 2004/0150296 | A1 | 8/2004 | Park et al. | WO | WO-2004/034579 | 4/2004 |
| 2004/0195937 | A1 | 10/2004 | Matsubara et al. | WO | WO-2004/015744 | 6/2004 |
| 2004/0257172 | A1 | 12/2004 | Schmidhammer et al. | WO | WO-2005/043752 | 5/2005 |
| 2004/0263287 | A1 | 12/2004 | Ginsburg et al. | WO | WO-2005/043753 | 5/2005 |
| 2005/0012570 | A1* | 1/2005 | Korden et al. ............... 333/189 | WO | WO-2005/043756 | 5/2005 |
| 2005/0023931 | A1* | 2/2005 | Bouche et al. .............. 310/327 | WO | WO-2003/018788 | 2/2006 |
| 2005/0030126 | A1 | 2/2005 | Inoue et al. | | | |
| 2005/0036604 | A1 | 2/2005 | Scott et al. | | | |
| 2005/0057117 | A1 | 3/2005 | Nakatsuka et al. | | | |
| 2005/0057324 | A1 | 3/2005 | Onishi et al. | | | |
| 2005/0068124 | A1 | 3/2005 | Stoemmer | | | |
| 2005/0093396 | A1 | 5/2005 | Larson et al. | | | |
| 2005/0093653 | A1 | 5/2005 | Larson, III | | | |
| 2005/0093654 | A1 | 5/2005 | Larson, III et al. | | | |
| 2005/0093655 | A1 | 5/2005 | Larson, III et al. | | | |
| 2005/0093657 | A1 | 5/2005 | Larson et al. | | | |
| 2005/0093658 | A1* | 5/2005 | Larson et al. ............... 333/191 | | | |
| 2005/0093659 | A1 | 5/2005 | Larson, III et al. | | | |
| 2005/0104690 | A1 | 5/2005 | Larson, III et al. | | | |
| 2005/0110598 | A1 | 5/2005 | Larson, III | | | |
| 2005/0128030 | A1 | 6/2005 | Larson et al. | | | |
| 2005/0140466 | A1 | 6/2005 | Larson, III et al. | | | |
| 2005/0167795 | A1 | 8/2005 | Higashi | | | |
| 2005/0193507 | A1* | 9/2005 | Ludwiczak ................ 15/93.1 | | | |
| 2005/0206271 | A1 | 9/2005 | Higuchi et al. | | | |
| 2005/0218488 | A1 | 10/2005 | Mie | | | |
| 2006/0087199 | A1 | 4/2006 | Larson et al. | | | |
| 2006/0103492 | A1 | 5/2006 | Feng et al. | | | |
| 2006/0125489 | A1 | 6/2006 | Feucht et al. | | | |
| 2006/0132262 | A1 | 6/2006 | Fazzlo et al. | | | |
| 2006/0164183 | A1 | 7/2006 | Tikka | | | |
| 2006/0185139 | A1 | 8/2006 | Larson, III et al. | | | |
| 2007/0084694 | A1 | 4/2007 | L. et al. | | | |
| 2007/0085447 | A1 | 4/2007 | Larson | | | |
| 2007/0170815 | A1 | 7/2007 | Unkrich | | | |
| 2007/0171002 | A1 | 7/2007 | Unkrich | | | |

FOREIGN PATENT DOCUMENTS

| | | |
|---|---|---|
| EP | 0689254 | 6/1995 |
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |

OTHER PUBLICATIONS

Martin et al., "Development of Low-Dielectric Constant Polymer for Fabrication of Integrated Circuit Interconnect", 12 Advanced Materials, 1769 (2000).

U.S. Appl. No. 11/253,464, filed Oct. 18, 2005, John D. Larson, III.

U.S. Appl. No. 11/253,851, filed Oct. 18, 2005, John D. Larson, III.

U.S. Appl. No. 11/253,463, filed Oct. 18, 2005, John D. Larson, III et al.

U.S. Appl. No. 11/253,444, filed Oct. 18, 2005, John D. Larson, III et al.

U.S. Appl. No. 11/252,845, filed Oct. 18, 2005, Ken Nishimura et al.

Search report from corresponding application No. GB0605779.8.

Examination report from corresponding application No. GB0605779.8 dated Aug. 23, 2006.

Holzlohner, Ronald et al., "Accurate Calculation of Eye Diagrams and Bit Error Rates in Optical Transmission Systems Using Linearization", *Journal of Lightwae Technology*, vol. 20, No. 3,, (Mar. 2002), pp. 389-400.

Reinhardt, Alexandre et al., "Design of Coupled Resonator Filters Using Admittance and Scattering Matrices", *2003 IEEE Ultrasonics Symposium*, (May 3, 2003), 1428-1431.

Lakin, K.M. "Coupled Resonator Filters", *2002 IEEE Ultrsonics Symoposium*, (Mar. 2, 2002), 901-908.

"Examination report corresponding to application No.", GB0605770.7, (Aug. 25, 2006).

"Examination Report corresponding to application No.", GB0605775.6, (Aug. 30, 2006).

Lankin, K.M. et al., "High Performance Stacked Crystal Filters for GPS and Wide Bandwidth Application", *2001 IEEE Ultrasonics Symposium*, (Jan. 1, 2001), 833-838.

Krishnaswamy, S.V. et al., "Film Bulk Acoustic Wave Resonator Technology", (May 29, 1990), 529-536.

Lobl, H.P. et al., "Piezoelectric Materials For BAW Resonators And Filters", *2001 IEEE Ultrasonics Symposium*, (Jan. 1, 2001), 807-811.

Lakin, K.M. "Bulk Acoustic Wave Coupled Resonator Filters", *2002 IEEE International Frequency Control Symposium and PDA Exhibition*, (Jan. 2, 2002), 8-14.

Jung, Jun-Phil et al., "Experimental And Theoretical Investigation On The Relationship Between AIN Properties And AIN-Based FBAR Characteristics", *2003 IEE International Frequency Control Symposium and PDA Exhibition Jointly with the 17th European Frequency and Time Forum*, (Sep. 3, 2003), 779-784.

Yang, C.M. et al., "Highly C Axis Iriented AIN Film Using MOCVD For 5GHx Band FBAR Filter", *2003 IEEE Ultrasonics Symposium*, (Oct. 5, 2003), pp. 170-173.

Hadimioglu, B. et al., ""Polymer Films As Acoustic Matching Layers"-", *1990 IEEE Ultrasonics Symposium Proceedings*, vol. 3 pp., Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007, (Dec. 1990), 1337-1340.

"Examination Report from UK for application", GB 0605971.1, (Aug. 24, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application NO.", GB0620657.7, (Nov. 23, 2006).

Coombs, Clyde F., et al., "Electronic Instrument Handbook", *Second Edition MgGraw-Hill, Inc.*, (1995), pp. 5.1-5.29.

Ruby, R. C., "Micro-Machined Thin Film Bulk Acoustic Resonators", *Proc. IEEE 48th, Symposium on Frequency control*, (1994), 135-138.

Larson III, J. D., et al., "Measurement of Effective Kt2q,RpRs vs. Temperature for Mo/AIN/Mo Resonators", *2002 IEEE Ultrasonics Symposium*, Munich Germany, (Oct. 2002), 915-919.

Aoyama, T. et al., "Diffusion of Baron, Phosphorous, Arsenic and Antimony in Thermally Grown SiliconDioxide", *Fiujitsu Labs, J. Electromechanical Soc.*, vol. 146, No. 5, (1999), 1879-1883.

Parker, T. E., et al., "Temperature-Compensated Surface Acoustic-Wave Devices with SiO2 Film Overlays", *J. Appl. Physics*, vol. 50, (1360-1369), Mar. 1979.

Tsubbouchi, K. et al., "Zero Temperature coefficient Surface Acoustic Wave Devices using Epitaxial AIN Films", *IEEE Ultrasonics symposium*, San Diaego, CA, 1082, (1982), 240-245.

Lakin, K. M., "Thin Film Resonators and Filters", *IEEE Untrasonics Symposium*, Caesar's Tahoe, NV, (Oct. 1999), 895-906.

Lakin, K. M., et al., "Temperature Compensated Bulk Acoustic Think Film Resonators", *IEEE Ultrasonics Symposium*, San Juan, Puerto Rico, (Oct. 2000), 855-858.

Ohta, S. et al., "Temperature Characteristics of Solidly Mounted Piezoelectric Think Film Resonators", *IEEE Ultrasonics Symposium*, Honolulu, HI, (Oct. 2003), 2011-2015.

Bauer, L. O., et al., "Properties of Silicon Implanted with Bacon Ions trough Thermal Silicon Dioxide", *Solid State Electronics*, vol. 16, No. 3, (Mar. 1973), 289-300.

Hara, K. "Surface Treatment of Quartz Oscillator Plate by Ion Implantation", *Oyo Buturi*, vol. 47, No. 2, (Feb. 1978), 145-146.

Ng, J. et al., "The Diffusion Ion-Implanted Boron in Silicon Dioxide", *AIP Conf. Proceedings*, No. 122, (1984), 20-33.

U.S. Appl. No. 10/971,169 filed Oct. 22, 2004, John D. Larson, III, et al.

"GB Search Report for", Application No. GB0522393.8, (Jan. 9, 2006), 4 pages.

"GB Search Report for Application No.", GB0525884.3, (Feb. 2, 2006), 4 pgs.

"Search Report from corresponding application", No. GB0605225.2.

"Search Report for Great Britain Patent Application", No. 0617742.2, (Mar. 29, 2007).

"British Search Report Application No.", 0605222.9, (Jul. 11, 2006).

"Search Report for Great Britian Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005), 217-221.

Schuessler, Hans H., "Ceremic Filters and Resonators", *Reprinted from IEEE Tran. Sonics Ultrason,*, vol. SU-21, (Oct. 1974), 257-268.

Fattinger, G. G., et al., "Coupled Bulk Acoustic Wave Resonator Filters: Key technology for single-to-balanced RF filters", 0-7803-8331-1/4/W20.00; IEEE MTT-S Digest, (2004), 927-929.

Choi, Sungjin et al., "Design of Half-Bridge Piezo-Transformer Converters in the AC Adapter Applications", IEEE 2005, 244-248.

Li, Yunxiu et al., "AC-DC Converter with Worldwide Range Input Voltage by Series and Parallel Piezoelectric Trnasformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transaction on Power Electronics*, vol. 19, No. 6., (Nov. 2004).

Navas, J. et al., "Minaturised Battery Charger using Piezoelectric Transformers", *IEEE*, (2001), 492-496.

Jiang, Yimin et al., "A Novel Single-Phase Power factor Correction Scheme", *IEEE*, (1993), 287-292.

Tiersten, H. F., et al., "An Analysis of Thiskness-Extensional Trapped Energy Resonant Device Structures with Rectangular Electrodes in the Piezoelectric Think Film on Silicon Configuration", *J. Appl. Phys.* 54 (10), (Oct. 1983), 5893-5910.

Auld, B. A., "Acoustic Resonators", *Acoustic Fields and Waves in Solids,* Second Edition, vol. II, (1990), 250-259.

\* cited by examiner

ACOUSTIC GALVANIC ISOLATOR INCORPORATING SINGLE INSULATED DECOUPLED STACKED BULK ACOUSTIC RESONATOR WITH ACOUSTICALLY-RESONANT ELECTRICAL INSULATOR

RELATED APPLICATIONS

This disclosure is related to the following simultaneously-filed disclosures: Acoustic Galvanic Isolator Incorporating Single Decoupled Stacked Bulk Acoustic Resonator of John D. Larson III, publication No. 2007-0090892; Acoustic Galvanic Isolator Incorporating Film Acoustically-Coupled Transformer of John D. Larson III, publication No. 2007-0085631; Acoustic Galvanic Isolator Incorporating Series-Connected Decoupled Stacked Bulk Acoustic Resonators of John D. Larson III et al., publication No. 2007-0086080; and Acoustic Galvanic Isolator of John D. Larson III et al., publication No. 2007-0085632, all of which are assigned to the assignee of this disclosure at the time of filing and incorporated by reference.

BACKGROUND

A galvanic isolator allows an information signal to pass from its input to its output but has no electrical conduction path between its input and its output. The lack of an electrical conduction path allows the galvanic isolator to prevent unwanted voltages from passing between its input and its output. Strictly speaking, a galvanic isolator blocks only DC voltage, but a typical galvanic isolator additionally blocks a.c. voltage, such as voltages at power line and audio frequencies. An example of a galvanic isolator is a data coupler that passes a high data rate digital information signal but blocks DC voltages and additionally blocks low-frequency a.c. voltages.

One example of a data coupler is an opto-isolator such as the opto-isolators sold by Agilent Technologies, Inc. In an opto-isolator, an electrical information signal is converted to a light signal by a light-emitting diode (LED). The light signal passes through an electrically non-conducting light-transmitting medium, typically an air gap or an optical waveguide, and is received by a photodetector. The photodetector converts the light signal back to an electrical signal. Galvanic isolation is provided because the light signal can pass through the electrically non-conducting light-transmitting medium without the need of metallic conductors.

Other data couplers include a transformer composed of a first coil magnetically coupled to a second coil. Passing the electrical information signal through the first coil converts the electrical information signal to magnetic flux. The magnetic flux passes through air or an electrically non-conducting permeable magnetic material to the second coil. The second coil converts the magnetic flux back to an electrical signal. The transformer allows the high data rate information signal to pass but blocks transmission of DC voltages and low-frequency a.c. voltages. The resistance of the conveyor of the magnetic flux is sufficient to prevent DC voltages and low-frequency a.c. voltages from passing from input to output. Blocking capacitors are sometimes used to provide similar isolation.

Inexpensive opto-isolators are typically limited to data rates of about 10 Mb/s by device capacitance, and from power limitations of the optical devices. The transformer approach requires that the coils have a large inductance yet be capable of transmitting the high data rate information signal. Such conflicting requirements are often difficult to reconcile. Using capacitors does not provide an absolute break in the conduction path because the information signal is transmitted electrically throughout. More successful solutions convert the electrical information signal to another form of signal, e.g., light or a magnetic flux, and then convert the other form of signal back to an electrical signal. This allows the electrical path between input and output to be eliminated.

Many data transmission systems operate at speeds of 100 Mb/s. What is needed is a compact, inexpensive galvanic isolator capable of operating at speeds of 100 Mb/s and above.

SUMMARY OF THE INVENTION

In a first aspect, the invention provides an acoustic galvanic isolator. Embodiments of the acoustic galvanic isolator comprise a carrier signal source, a modulator connected to receive an information signal and the carrier signal, a demodulator, and an electrically-isolating acoustic coupler connected between the modulator and the demodulator. The acoustic coupler comprises no more than one insulated decoupled stacked bulk acoustic resonator (IDSBAR) having an acoustically-resonant electrical insulator.

In a first embodiment of the IDSBAR, the IDSBAR comprises a first film bulk acoustic resonator (FBAR), a second FBAR stacked on the first FBAR, and a first acoustic decoupler, the acoustically-resonant electrical insulator and a second acoustic decoupler located between the FBARs. In this first embodiment, the acoustically-resonant electrical insulator comprises a quarter-wave layer of electrically-insulating material and is located between the first acoustic decoupler and the second acoustic coupler.

In a second embodiment of the IDSBAR, the acoustically-resonant electrical insulator is a first acoustically-resonant electrical insulator and the IDSBAR additionally comprises a first FBAR, a second FBAR stacked on the first FBAR, and, between the FBARs, in order, the first acoustically-resonant electrical insulator, an acoustic decoupler and a second acoustically-resonant electrical insulator. In this second embodiment, each acoustically-resonant electrical insulator is a half-wave acoustically-resonant electrical insulator and comprises a half-wave layer of electrically-insulating material.

In a second aspect, the invention provides a method for galvanically isolating an information signal. Embodiments of the method comprise providing an electrically-isolating acoustic coupler comprising no more than one insulated decoupled stacked bulk acoustic resonator (IDSBAR) having an acoustically-resonant electrical insulator; providing a carrier signal; modulating the carrier signal with the information signal to form a modulated electrical signal; acoustically coupling the modulated electrical signal through the electrically-isolating acoustic coupler; and recovering the information signal from the modulated electrical signal acoustically coupled through the electrically-isolating acoustic coupler.

An electrically-isolating acoustic coupler based on a single IDSBAR is physically small and is inexpensive to fabricate yet is capable of acoustically coupling information signals having data rates in excess of 100 Mbit/s and has a substantial breakdown voltage between its inputs and its outputs.

DETAILED DESCRIPTION

Figure 1:
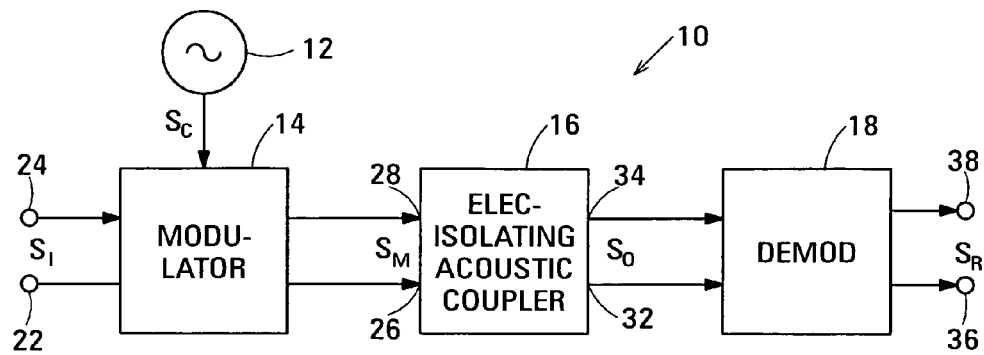
FIG. 1 is a block diagram showing an acoustic galvanic isolator in accordance with an embodiment of the invention.

FIG. 1 is a block diagram showing an acoustic galvanic isolator 10 in accordance with an embodiment of the invention. Acoustic galvanic isolator 10 transmits an electrical information signal $S_I$ between its input terminals and its output terminals yet provides electrical isolation between its input terminals and its output terminals. Acoustic galvanic isolator 10 not only provides electrical isolation at DC but also provides a.c. electrical isolation. Electrical information signal $S_I$ is typically a high data rate digital data signal, but may alternatively be an analog signal. In one application, electrical information signal $S_I$ is a 100 Mbit/sec Ethernet signal.

In the example shown, acoustic galvanic isolator 10 is composed of a local oscillator 12, a modulator 14, an electrically-isolating acoustic coupler 16 and a demodulator 18. In the example shown, local oscillator 12 is the source of an electrical carrier signal $S_C$. Modulator 14 has inputs connected to receive electrical information signal $S_I$ from input terminals 22, 24 of acoustic galvanic isolator 10 and to receive carrier signal $S_C$ from local oscillator 12. Modulator 14 has outputs connected to inputs 26, 28 of electrically-isolating acoustic coupler 16.

Outputs 32, 34 of electrically-isolating acoustic coupler 16 are connected to the inputs of demodulator 18. The outputs of demodulator 18 are connected to the output terminals 36, 38 of acoustic galvanic isolator 10.

Electrically-isolating acoustic coupler 16 has a band-pass frequency response that will be described in more detail below with reference to FIG. 4. Local oscillator 12 generates carrier signal $S_C$ at a frequency nominally at the center of the pass band of electrically-isolating acoustic coupler 16. In one exemplary embodiment of acoustic galvanic isolator 10, the pass band of electrically-isolating acoustic coupler 16 is centered at a frequency of 1.9 GHz, and local oscillator 12 generated carrier signal $S_C$ at a frequency of 1.9 GHz. Local oscillator 12 feeds carrier signal $S_C$ to the carrier signal Modulator 14 receives electrical information signal $S_I$ from input terminals 22, 24 and modulates carrier signal $S_C$ with electrical information signal $S_I$ to generate modulated electrical signal $S_M$. Typically, modulated electrical signal $S_M$ is carrier signal $S_C$ modulated in accordance with electrical information signal $S_I$. Any suitable modulation scheme may be used. In an example in which carrier signal is amplitude modulated by electrical information signal $S_I$ and electrical information signal $S_I$ is a digital signal having low and high signal levels respectively representing 0s and 1s, modulated electrical signal $S_M$ has small and large amplitudes respectively representing the 0s and 1s of the electrical information signal.

As will be described in more detail below, electrically-isolating acoustic coupler 16 acoustically couples modulated electrical signal $S_M$ from its inputs 26, 28 to its outputs 32, 34 to provide an electrical output signal $S_O$ to the inputs of demodulator 18. Electrical output signal $S_O$ is similar to modulated electrical signal $S_M$, i.e., it is a modulated electrical signal having the same frequency as carrier signal $S_C$, the same modulation scheme as modulated electrical signal and the same information content as electrical information signal $S_I$. Demodulator 18 demodulates electrical output signal $S_O$ to recover electrical information signal $S_I$ as recovered electrical information signal $S_R$. Recovered electrical information signal $S_R$ is output from demodulator 18 to output terminals 36, 38.

Demodulator 18 comprises a detector (not shown) that recovers electrical information signal $S_I$ from electrical output signal $S_O$ as is known in the art. In an example, the detector rectifies and integrates electrical output signal $S_O$ to recover electrical information signal $S_I$. Typically, in an embodiment intended for applications in which electrical information signal $S_I$ is a digital signal, demodulator 18 additionally includes a clock and data recovery (CDR) circuit following the detector. The CDR circuit operates to clean up the waveform of the raw electrical information signal recovered from the electrical output signal $S_O$ to generate recovered electrical information signal $S_R$. Demodulator 18 provides the recovered electrical information signal $S_R$ to the output terminals 36, 38 of acoustic galvanic isolator 10.

Circuits suitable for use as local oscillator 12, modulator 14 and demodulator 18 of acoustic galvanic isolator 10 are known in the art. Consequently, local oscillator 12, modulator 14 and demodulator 18 will not be described in further detail.

In the embodiment shown in FIG. 1, local oscillator 12 is shown as part of acoustic galvanic isolator 10. In other embodiments, instead of a local oscillator, acoustic galvanic isolator 10 has carrier signal input terminals (not shown) via which the acoustic galvanic isolator receives the carrier signal $S_C$ from an external carrier signal generator. In such embodiments, the carrier signal input terminals provide the carrier signal source for the acoustic galvanic isolator.

Acoustic couplers in according with embodiments of the invention that can be used as electrically-isolating acoustic coupler 16 in acoustic galvanic isolator 10 will now be described. Such embodiments all have a band-pass frequency response, as will be described in more detail below with reference to FIG. 4. The pass-band of the acoustic coupler is characterized by a center frequency and a bandwidth. The bandwidth of the pass-band determines the maximum data rate of the information signal that can be acoustically coupled by the acoustic coupler. For simplicity, the center frequency of the pass band of the acoustic coupler will be referred to as the center frequency of the acoustic coupler. As will be described further below, the acoustic coupler embodiments are composed in part of layers of various acoustically-transmissive materials whose thickness depends on the wavelength in the acoustically-transmissive material of an acoustic signal nominally equal in frequency to the center frequency of the acoustic coupler. In acoustic galvanic isolator 10 shown in FIG. 1, the frequency of carrier signal $S_C$ is nominally equal to the center frequency of the acoustic coupler used as electrically-isolating acoustic coupler 16.

In this disclosure, the term quarter-wave layer will be used to denote a layer of acoustically-transmissive material having a nominal thickness t equal to an odd integral multiple of one quarter of the wavelength in the material of an acoustic signal nominally equal in frequency to the center frequency of the acoustic coupler, i.e.:

$$t \approx (2m+1)\lambda_n/4 \qquad (1)$$

where $\lambda_n$ is the wavelength of the above-mentioned acoustic signal in the acoustically-transmissive material and m is an integer equal to or greater than zero. The thickness of a quarter-wave layer may differ from the nominal thickness by approximately ±10% of $\lambda_n/4$. A thickness outside this tolerance range can be used with some degradation in performance, but the thickness of a quarter-wave layer always differs significantly from an integral multiple of $\lambda_n/2$.

Moreover, in this disclosure, a quarter wave layer having a thickness equal to a specific number of quarter wavelengths of the above-mentioned acoustic signal in the material of the layer will be denoted by preceding the term quarter-wave layer by a number denoting the number of quarter wavelengths. For example, the term one quarter-wave layer will be used to denote a layer of acoustically-transmissive material having a nominal thickness t equal to one quarter of the wavelength in the material of an acoustic signal equal in frequency to the center frequency of the acoustic coupler, i.e., $t \approx \lambda_n/4$ (m=0 in equation (1)). A one quarter-wave layer is a quarter-wave layer of a least-possible thickness. Similarly, a three quarter-wave layer has a nominal thickness t equal to three quarters of the wavelength in the material of the above-mentioned acoustic signal, i.e., $t \approx 3\lambda_n/4$ (m=1 in equation (1)).

The term half-wave layer will be used to denote a layer of acoustically-transmissive material having a nominal thickness t equal to an integral multiple of one half of the wavelength in the material of an acoustic signal equal in frequency to the center frequency of the acoustic coupler, i.e.:

$$t \approx n\lambda_n/2 \qquad (2)$$

where n is an integer greater than zero. The thickness of a half-wave layer may differ from the nominal thickness by approximately ±10% of $\lambda_n/2$. A thickness outside this tolerance range can be used with some degradation in performance, but the thickness of a half-wave layer always differs significantly from an odd integral multiple of $\lambda_n/4$. The term half-wave layer may be preceded with a number to denote a layer having a thickness equal to a specific number of half wavelengths of the above-mentioned acoustic signal in the material of the layer.

Acoustic galvanic isolators and their constituent electrically-isolating acoustic couplers are characterized by a breakdown voltage. The breakdown voltage of an acoustic galvanic isolator is the voltage that, when applied between the input terminals and output terminals of the acoustic galvanic isolator, causes a leakage current greater than a threshold leakage current to flow. In acoustic galvanic isolators with multiple input terminals and multiple output terminals, as in this disclosure, the input terminals are electrically connected to one another and the output terminals are electrically connected to one another to make the breakdown voltage measurement. The breakdown voltage of an electrically-isolating acoustic coupler is the voltage that, when applied between the inputs and outputs of the acoustically-resonant electrical insulator, causes a leakage current greater than a threshold leakage current to flow. In electrically-isolating acoustic couplers with multiple inputs and multiple outputs, as in this disclosure, the inputs are electrically connected to one another and the outputs are electrically connected to one another to make the breakdown voltage measurement. The threshold leakage current is application-dependent, and is typically of the order of microamps.

Figures 2, 3:
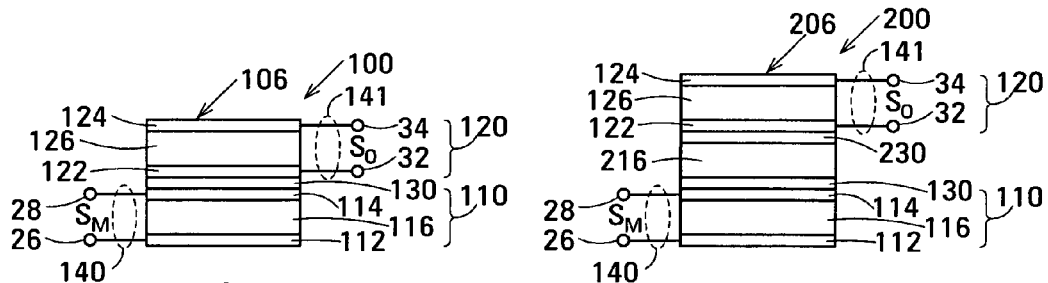
FIG. 2 is a schematic diagram showing an example of an acoustic coupler that may be used as the electrically-isolating acoustic coupler of the acoustic galvanic isolator shown in FIG. 1.
FIG. 3 is a schematic diagram showing an acoustic coupler in accordance with a first embodiment of the invention that may be used as the electrically-isolating acoustic coupler of the acoustic galvanic isolator shown in FIG. 1.

FIG. 2 is a schematic diagram of an exemplary embodiment 100 of an electrically-isolating acoustic coupler disclosed in the above-mentioned U.S. patent application entitled Acoustic Galvanic Isolator Incorporating Single Decoupled Stacked Bulk Acoustic Resonator of John D. Larson III assigned to the assignee of this application and incorporated by reference. Acoustic coupler 100 comprises a single decoupled stacked bulk acoustic resonator (DSBAR) 106, inputs 26, 28, outputs 32, 34, an electrical circuit 140 that connects DSBAR 106 to inputs 26, 28 and an electrical circuit 141 that connects DSBAR 106 to outputs 32, 34. DSBAR 106 incorporates an electrically-insulating acoustic decoupler 130 that provides electrical isolation between inputs 26, 28 and outputs 32, 34.

When used as electrically-isolating acoustic coupler 16 in acoustic galvanic isolator 10 shown in FIG. 1, acoustic coupler 100 acoustically couples modulated electrical signal $S_M$ from inputs 26, 28 to outputs 32, 34 while providing electrical isolation between inputs 26, 28 and outputs 32, 34. Thus, acoustic coupler 100 effectively galvanically isolates output terminals 36, 38 from input terminals 22, 24, and allows the output terminals to differ in voltage from the input terminals by a voltage up to its specified breakdown voltage.

DSBAR 106 is composed of a lower film bulk acoustic resonator (FBAR) 110, an upper FBAR 120 stacked on FBAR 110, and an electrically-insulating acoustic decoupler 130 between lower FBAR 110 and upper FBAR 120. FBAR 110 is composed of opposed planar electrodes 112 and 114 and a piezoelectric element 116 between the electrodes. FBAR 120 is composed of opposed planar electrodes 122 and 124 and a piezoelectric element 126 between the electrodes. Acoustic decoupler 130 is located between electrode 114 of FBAR 110 and electrode 122 of FBAR 120.

Electrical circuit 140 electrically connects electrodes 112 and 114 of FBAR 110 to inputs 26, 28, respectively. Electrical circuit 141 electrically connects electrodes 122 and 124 of FBAR 120 to outputs 32, 34, respectively. Modulated electrical signal $S_M$ received at inputs 26, 28 applies a voltage between electrodes 112 and 114 of FBAR 110. FBAR 110 converts the modulated electrical signal $S_M$ to an acoustic signal. Specifically, the voltage applied to piezoelectric element 116 by electrodes 112 and 114 mechanically deforms piezoelectric element 116, which causes FBAR 110 to vibrate mechanically at the frequency of the modulated electrical signal. Electrically-insulating acoustic coupler 130 couples part of the acoustic signal generated by FBAR 110 to FBAR 120. Additionally, electrically-insulating acoustic decoupler 130 is electrically insulating and therefore electrically isolates FBAR 120 from FBAR 110. FBAR 120 receives the acoustic signal coupled by acoustic decoupler 130 and converts the acoustic signal back into an electrical signal that appears across piezoelectric element 126. The electrical signal is picked up by electrodes 122 and 124 and is fed to outputs 32, 34, respectively, as electrical output signal $S_O$.

Electrical output signal $S_O$ appearing between outputs 32, 34 has the same frequency and includes the information content of the modulated electrical signal $S_M$ applied between inputs 26, 28. Thus, acoustic coupler 100 effectively acoustically couples the modulated electrical signal $S_M$ from inputs 26, 28 to outputs 32, 34.

Acoustic decoupler 130 controls the coupling of the acoustic signal generated by FBAR 110 to FBAR 120 and, hence, the bandwidth of acoustic coupler 100. Specifically, due to a substantial mis-match in acoustic impedance between the acoustic decoupler and FBARs 110 and 120, the acoustic decoupler couples less of the acoustic signal generated by FBAR 110 to FBAR 120 than would be coupled by direct contact between the FBARs.

The breakdown voltage of acoustic galvanic isolator 10 between input terminals 22, 24 and output terminals 36, 38 depends in a typical embodiment on the breakdown voltage of acoustic coupler 100 shown in FIG. 2. The breakdown voltage of acoustic coupler 100 depends in typical embodiments on the breakdown voltage of electrically-insulating acoustic decoupler 130. In some embodiments, acoustic decoupler 130 is composed of a one quarter wave layer of acoustic decoupling material. A one quarter-wave layer of a typical acoustic decoupling material is of the order of 200 nm thick. The breakdown voltage of an embodiment of acoustic coupler 100 incorporating such an acoustic decoupler depends on the thickness of acoustic decoupling layer and the breakdown field of the acoustic decoupling material. Increasing the thickness of the acoustic decoupling layer increases the breakdown voltage of the acoustic coupler at the expense of a reduction in the signal integrity with which modulated electrical signal $S_M$ is coupled from inputs 26, 28 to outputs 32, 34. This increases the difficulty of successfully recovering recovered electrical information signal $S_R$ from electrical output signal $S_O$. The signal integrity of electrical output signal $S_O$ is degraded by the ability of the thicker acoustic decoupler to support multiple acoustic modes.

In other embodiments of acoustic coupler 100, acoustic decoupler 130 is composed of an electrically-insulating Bragg structure. Embodiments of acoustic decoupler 130 in which the Bragg structure has more than one insulating layer typically have a greater breakdown voltage than embodiments composed of a single acoustic decoupling layer.

Some galvanic isolators are required to have a breakdown voltage between their input terminals and output terminals of greater than one kilovolt. In acoustic coupler 100, acoustic decoupler 130 is the sole provider of electrical isolation between inputs 26, 28 and outputs 32, 34. Embodiments of acoustic galvanic isolator 10 in which electrically-isolating acoustic coupler 16 is embodied as acoustic coupler 100 have difficulty in meeting such breakdown voltage requirements.

Additional embodiments of an acoustic coupler in accordance with the invention will be described next. These embodiments comprise a single insulating decoupled stacked bulk acoustic resonator (IDSBAR) having one or more acoustically-resonant electrical insulators located between its constituent film bulk acoustic resonators (FBARs). The one or more acoustically-resonant electrical insulators provide more electrical isolation between inputs 26, 28 and outputs 32, 34 than is provided by electrically-insulating acoustic decoupler 130 described above. Accordingly, acoustic couplers in accordance with these embodiments of the invention have a substantially greater breakdown voltage than acoustic coupler 100 described above with reference to FIGS. 2 and 4A-4C.

FIG. 3 is a schematic diagram showing an example of an acoustic coupler 200 in accordance with a first embodiment of the invention. Acoustic coupler 200 comprises an insulated decoupled stacked bulk acoustic resonator (IDSBAR) 206 in accordance with a first IDSBAR embodiment. In its simplest form, an IDSBAR in accordance with the first IDSBAR embodiment has a first acoustic decoupler, a quarter-wave acoustically-resonant electrical insulator and a second acoustic decoupler in order between its constituent FBARs. IDSBAR 206 in accordance with the first IDSBAR embodiment gives acoustic coupler 200 a substantially greater breakdown voltage than acoustic coupler 100 described above with reference to FIG. 2. In the example shown in FIG. 3, acoustic coupler 200 additionally comprises inputs 26, 28, outputs 32, 34, an electrical circuit 140 that connects IDSBAR 206 to inputs 26, 28, and an electrical circuit 141 that connects IDSBAR 206 to outputs 32, 34.

When used as electrically-isolating acoustic coupler 16 in acoustic galvanic isolator 10 shown in FIG. 1, acoustic coupler 200 acoustically couples modulated electrical signal $S_M$ from inputs 26, 28 to outputs 32, 34 while providing electrical isolation between inputs 26, 28 and outputs 32, 34. Thus, acoustic coupler 200 effectively galvanically isolates output terminals 36, 38 from input terminals 22, 24, and allows the output terminals to differ in voltage from the input terminals by a voltage up to its specified breakdown voltage.

The exemplary embodiment of IDSBAR 206 shown in FIG. 3 comprises a lower film bulk acoustic resonator (FBAR) 110, an upper film bulk acoustic resonator 120 stacked on FBAR 110 and, located in order between lower FBAR 110 and upper FBAR 120, a first acoustic decoupler 130, a quarter-wave acoustically-resonant electrical insulator 216 and a second acoustic decoupler 230. Other embodiments of IDSBAR 206 comprise two or more (n) quarter-wave acoustically-resonant electrical insulators interleaved with a corresponding number (n+1) of acoustic decouplers located between FBARs 110 and 120.

FBARs 110 and 120 and electrical circuits 140 and 141 are described above with reference to FIG. 2 and will not be described again here. First acoustic decoupler 130, acoustically-resonant electrical insulator 216 and second acoustic decoupler 230 are located between electrode 114 of FBAR 110 and electrode 122 of FBAR 120.

Modulated electrical signal $S_M$ received at inputs 26, 28 applies a voltage between electrodes 112 and 114 of FBAR 110. FBAR 110 converts the modulated electrical signal $S_M$ to an acoustic signal having the same frequency as modulated electrical signal $S_M$, i.e., at the same frequency as carrier signal $S_C$. Specifically, the voltage applied across piezoelectric element 116 by electrodes 112 and 114 mechanically deforms piezoelectric element 116, which causes FBAR 110 to vibrate at the frequency of modulated electrical signal $S_M$. Part of the acoustic signal generated by FBAR 110 in response to modulated electrical signal $S_M$ is coupled by first acoustic decoupler 130 to acoustically-resonant electrical insulator 216. Acoustically-resonant electrical insulator 216 is structured to be acoustically resonant at the same frequency as FBARs 110 and 120. Acoustically-resonant electrical insulator 216 receives the acoustic signal coupled by first acoustic decoupler 130 and vibrates in response to the acoustic signal. Part of the acoustic signal generated by the vibration of acoustically-resonant electrical insulator 216 is coupled by second acoustic decoupler 230 to FBAR 120. FBAR 120 receives the acoustic signal coupled by second acoustic decoupler 230 and converts the acoustic signal back into an electrical signal. The output electrical signal $S_O$ that appears across piezoelectric element 126 is picked up by electrodes 122 and 124 and is fed to outputs 32, 34, respectively. The electrical output signal $S_O$ appearing between outputs 32, 34 has the same frequency and includes the information content of the modulated electrical signal $S_M$ applied between inputs 26, 28.

Acoustically-resonant electrical insulator 216 is composed of a quarter-wave layer of electrically-insulating material. Embodiments of acoustic coupler 200 in which acoustically-resonant electrical insulator 216 is a one quarter-wave layer typically couple modulated electrical signal $S_M$ from inputs 26, 28 to outputs 32, 34 with optimum signal integrity.

Acoustically-resonant electrical insulator 216 electrically insulates FBAR 120 from FBAR 110. Typically, acoustic decouplers 130 and 230 are also electrically insulating and therefore provide additional electrical insulation between FBAR 110 and FBAR 120. Thus, acoustic coupler 200 effectively couples the modulated electrical signal $S_M$ from inputs 26, 28 to outputs 32, 34 but electrically isolates outputs 32, 34 from inputs 26, 28.

The electrically-insulating material of acoustically-resonant electrical insulator 216 is typically a dielectric or piezoelectric material matched in acoustic impedance to FBARs 110 and 120. For example, acoustically-resonant electrical insulator 216 may be fabricated from the same material as piezoelectric elements 116 and 126 of FBARs 110 and 120 respectively. In embodiments in which the acoustically-resonant electrical insulator 216 and the piezoelectric elements 116 and 126 differ in acoustic impedance, the difference in acoustic impedance is substantially less than one order of magnitude. In an example, the acoustic impedances have a ratio of less than two. The material of acoustically-resonant electrical insulator 216 differs from that of piezoelectric elements 116 and 126 in an embodiment in which the material of acoustically-resonant electrical insulator 216 is a dielectric, for example. Suitable dielectric materials for acoustically-resonant electrical insulator 216 include aluminum oxide $Al_2O_3$ and non-piezoelectric aluminum nitride AlN.

Although acoustically-resonant electrical insulator 216 is optimally a one quarter-wave layer, the velocity of sound in the typical piezoelectric and dielectric materials of acoustically-resonant electrical insulator 216 is substantially higher than in typical materials of acoustic decouplers 130 and 230 described below. Consequently, an acoustically-resonant electrical insulator 216 that is a one quarter-wave layer of aluminum nitride, for example, has a thickness about seven times that of a one quarter-wave layer of a typical acoustic decoupling material. As a result, a given voltage between inputs 26, 28 and outputs 32, 34 produces a much lower electric field when applied across such an embodiment of acoustically-resonant electrical insulator 216 than when applied across acoustic decoupler 130 of acoustic coupler 100 shown in FIG. 2. Consequently, acoustic coupler 200 typically has a greater breakdown voltage than acoustic coupler 100 shown in FIG. 2.

In acoustic coupler 200, first acoustic decoupler 130 controls the coupling of the acoustic signal generated by FBAR 110 to acoustically-resonant electrical insulator 216 and second acoustic decoupler 230 controls the coupling of the acoustic signal from acoustically-resonant electrical insulator 216 to FBAR 120. Collectively, acoustic decouplers 130 and 230 define the bandwidth of acoustic coupler 200. Specifically, due to the substantial mis-match in acoustic impedance between first acoustic decoupler 130 on one hand and FBAR 110 and acoustically-resonant electrical insulator 216 on the other hand, acoustic decoupler 130 couples less of the acoustic signal from FBAR 110 to acoustically-resonant electrical insulator 216 than would be coupled by direct contact between the FBAR 110 and acoustically-resonant electrical insulator 216. Similarly, due to the substantial mis-match in acoustic impedance between second acoustic decoupler 230 on one hand and acoustically-resonant electrical insulator 216 and FBAR 120 on the other hand, acoustic decoupler 230 couples less of the acoustic signal from acoustically-resonant electrical insulator 216 to FBAR 120 than would be coupled by direct contact between acoustically-resonant electrical insulator 216 and FBAR 120. The two acoustic decouplers 130 and 230 cause acoustic coupler 200 to have a somewhat narrower bandwidth than acoustic coupler 100 described above with reference to FIG. 2, which has a single acoustic decoupler 130.

Figure 4:
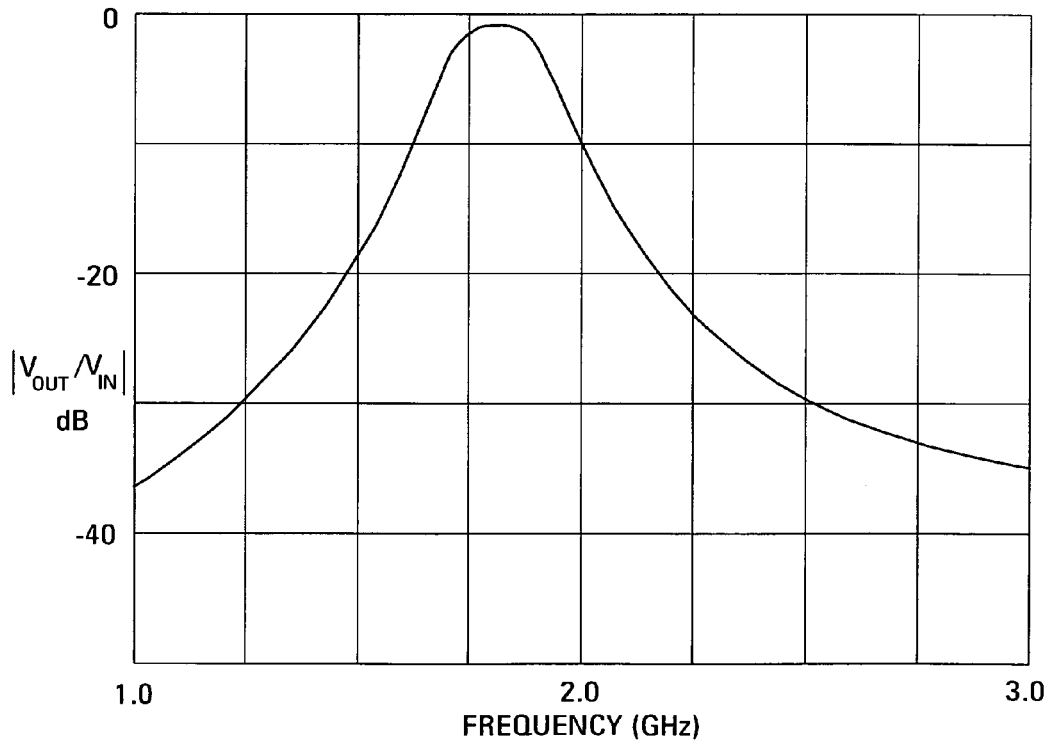
FIG. 4 is a graph showing the frequency response characteristic of an exemplary embodiment of the insulating decoupled stacked bulk acoustic resonator (IDSBAR) that forms part of the acoustic coupler shown in FIG. 3.

FIG. 4 shows the frequency response characteristic of an exemplary embodiment of IDSBAR 206. IDSBAR 206 exhibits a flat in-band response with a pass bandwidth of greater than 100 MHz, which is sufficiently broad to transmit the full bandwidth of an embodiment of modulated electrical signal $S_M$ resulting from modulating carrier signal $S_C$ with an embodiment of electrical information signal $S_I$ having a data rate greater than 100 Mbit/s. The frequency response of IDSBAR 206 additionally exhibits a sharp roll-off outside the pass band.

Figure 5A:
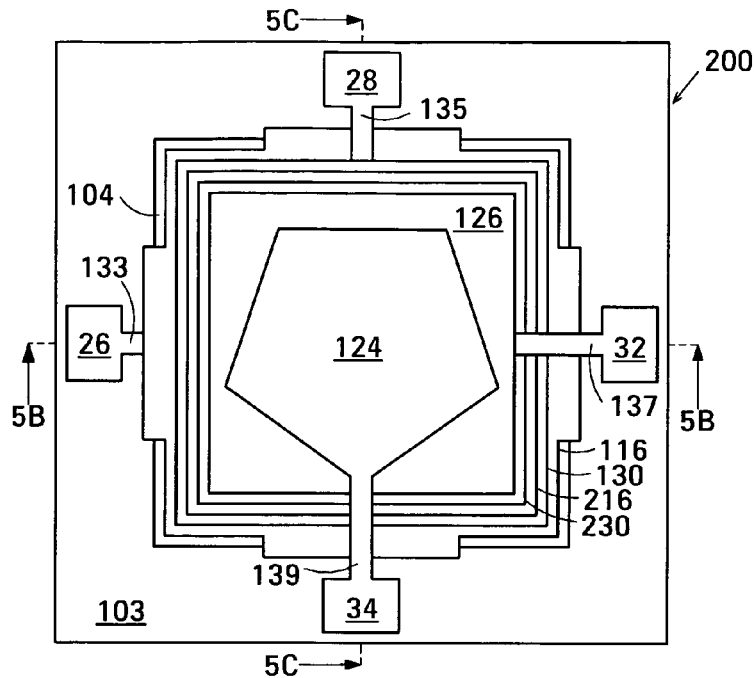
FIG. 5A is a plan view showing a practical example of the acoustic coupler shown in FIG. 3.
Figure 5B:
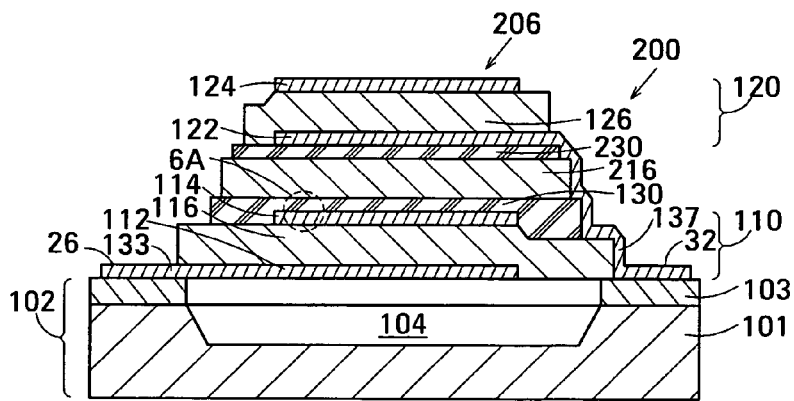
FIGS. 5B and 5C are cross-sectional views along section lines 5B-5B and 5C-5C, respectively, shown in FIG. 5A.
Figure 5C:
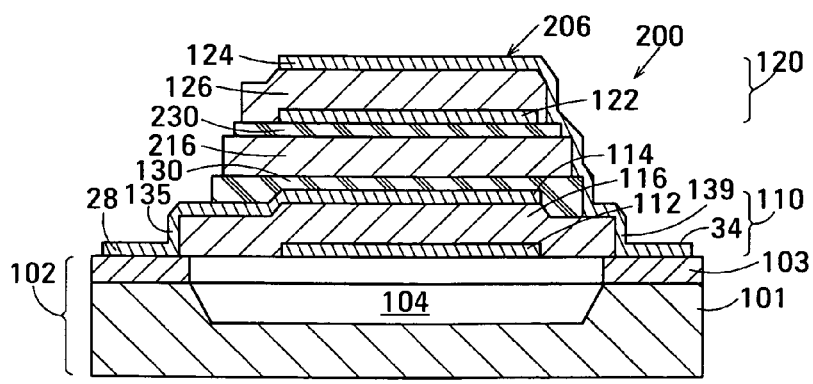

FIG. 5A is a plan view showing the structure of an exemplary embodiment of acoustic coupler 200. FIGS. 5B and 5C are cross-sectional views along section lines 5B-5B and 5C-5C, respectively, shown in FIG. 5A. The same reference numerals are used to denote the elements of acoustic coupler 200 in FIG. 3 and in FIGS. 5A-5C.

In the embodiment of acoustic coupler 200 shown in FIGS. 5A-5C, IDSBAR 206 is suspended over a cavity 104 defined in a substrate 102. Suspending IDSBAR 206 over a cavity allows stacked FBARs 110, 120 and acoustically-resonant electrical insulator 216 constituting IDSBAR 206 to resonate mechanically in response to modulated electrical signal $S_M$. Other suspension schemes that allow the stacked FBARs and the acoustically-resonant electrical insulator to resonate mechanically are possible. For example, IDSBAR 206 can be acoustically isolated from substrate 102 by an acoustic Bragg reflector (not shown), as described by John D. Larson III et al. in United States patent application publication no. 2005 0 104 690 entitled Cavity-Less Film Bulk Acoustic Resonator (FBAR) Devices, assigned to the assignee of this disclosure and incorporated by reference.

In some embodiments, the material of substrate 102 is single-crystal silicon. However, since single-crystal silicon is a semiconductor and is therefore not a good electrical insulator, substrate 102 is typically composed of a base layer 101 of single crystal silicon and an insulating layer 103 of a dielectric material located on the major surface of the base layer, as in the example shown in FIGS. 5A-5C. Exemplary materials of the insulating layer include aluminum nitride, silicon nitride, polyimide, a crosslinked polyphenylene polymer and any other suitable electrically-insulating material. Insulating layer 103 insulates IDSBAR 206 and electrical circuits 140 and 141 (FIG. 3) from base layer 101. Alternatively, the material of substrate 102 can be a ceramic material, such as alumina, that has a very high electrical resistivity and breakdown field.

In the embodiment of acoustic coupler 200 shown in FIGS. 5A-5C, inputs 26, 28 shown in FIG. 3 are embodied as terminal pads 26 and 28, respectively, located on the major surface of substrate 102. Electrical circuit 140 shown in FIG. 3 is composed of an electrical trace 133 that extends from terminal pad 26 to electrode 112 of FBAR 110 and an electrical trace 135 that extends from terminal pad 28 to electrode 114 of FBAR 110. Electrical trace 133 extends over part of the major surface of substrate 102 and under part of piezoelectric element 116 and electrical trace 135 extends over part of the major surface of substrate 102 and over part of piezoelectric element 116. Outputs 32, 34 are embodied as terminal pads 32 and 34 located on the major surface of substrate 102. Electrical circuit 141 shown in FIG. 3 is composed of an electrical trace 137 that extends from terminal pad 32 to electrode 122 of FBAR 120 and an electrical trace 139 that extends from terminal pad 34 to electrode 124 of FBAR 120. Electrical trace 137 extends over parts of the major surfaces of acoustic decoupler 230, acoustically-resonant electrical insulator 216, acoustic decoupler 130, piezoelectric element 116 and substrate 102. Electrical trace 139 extends over parts of the major surfaces of piezoelectric element 126, acoustic decoupler 230, acoustically-resonant electrical insulator 216, acoustic decoupler 130, piezoelectric element 116 and substrate 102.

In some embodiments of acoustic galvanic isolator 10, local oscillator 12, modulator 14, electrically-isolating acoustic coupler 16 and demodulator 18 are fabricated in and on a common substrate 102. In such embodiments, terminal pads 26, 28, 32 and 34 are typically omitted and electrical traces 133 and 135 are extended to connect to corresponding traces constituting part of modulator 14 and electrical traces 137 and 139 are extended to connect to corresponding traces constituting part of demodulator 18.

Figure 6A:
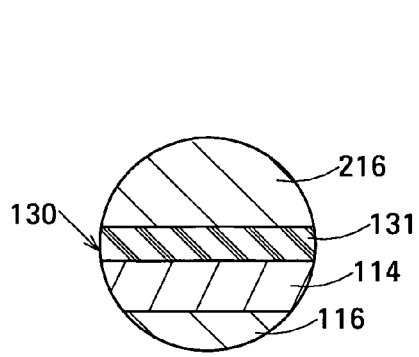
FIG. 6A is an enlarged view of the portion marked 6A in FIG. 5B showing a first embodiment of the acoustic decoupler.

FIG. 6A is an enlarged view of the portion marked 6A in FIG. 5B showing a first embodiment of first acoustic decoupler 130. In the embodiment shown in FIG. 6A, first acoustic decoupler 130 is composed of an acoustic decoupling layer 131 of acoustic decoupling material located between the electrode 114 of FBAR 110 and acoustically-resonant electrical insulator 216. Second acoustic decoupler 230 (FIG. 5B) is composed of an acoustic decoupling layer 231 of acoustic decoupling material located between acoustically-resonant electrical insulator 216 and the electrode 122 of FBAR 120. First acoustic decoupler will now be described in more detail. The following description of acoustic decoupler 130 also applies to acoustic decoupler 230, so acoustic decoupler 230 will not be separately described.

The acoustic decoupling material of acoustic decoupling layer 131 is intermediate in acoustic impedance between air on one hand and the materials of FBARs 110 and 120 and acoustically-resonant electrical insulator 216 on the other hand. In embodiments in which acoustic decoupler 130 provides additional electrical insulation between FBARs 110 and 120, the acoustic decoupling material additionally has a high electrical resistivity and a high breakdown field.

The piezoelectric material of the piezoelectric elements 116 and 126 of FBARs 110 and 120, respectively is typically aluminum nitride (AlN) and the material of electrodes 112, 114, 122 and 124 is typically molybdenum (Mo). The material of some embodiments of acoustically-resonant electrical insulator 216 is also aluminum nitride. Samples of sputter-deposited aluminum nitride have a measured breakdown field of about 875 kV/mm. The acoustic impedance of AlN is typically about 35 Mrayl and that of molybdenum is about 63 Mrayl. The acoustic impedance of air is about 1 krayl.

Typically, the acoustic impedance of the acoustic decoupling material of acoustic decoupling layer 131 is about one order of magnitude less that of the piezoelectric material that constitutes the piezoelectric elements 116 and 126 of FBARs 110 and 120, respectively. The bandwidth of the pass band of acoustic coupler 200 depends on the difference in acoustic impedance between the acoustic decoupling material of acoustic decoupling layer 131 and the materials of FBAR 110 and acoustically-resonant electrical insulator 216. In embodiments of acoustic coupler 200 in which the material of FBAR 110 are as stated above, acoustic decoupling materials with an acoustic impedance in the range from about 2 Mrayl to about 8 Mrayl will result in acoustic decoupler having a pass bandwidth sufficient to allow acoustic galvanic isolator 10 (FIG. 1) to operate at data rates greater than 100 Mb/s.

In the embodiment of acoustic decoupler 130 shown in FIG. 6A, acoustic decoupling layer 131 is a quarter-wave layer. However, an embodiment of acoustic coupler 200 in which the acoustic decoupling layer 131 is thicker than a one quarter-wave layer typically has a frequency response that exhibits spurious response artifacts due to the ability of such a thicker acoustic decoupling layer to support multiple acoustic modes. The spurious response artifacts tend to reduce the opening of the "eye" of the electrical output signal $S_O$ output by acoustic coupler 200. To ensure the integrity of the recovered electrical information signal $S_R$ output by acoustic galvanic isolator 10 (FIG. 1), embodiments in which acoustic coupler 200 has a layer thicker than a one quarter-wave layer as acoustic decoupling layer 131 typically use a more sophisticated type of clock and data recovery circuit in demodulator 18 than embodiments in which acoustic coupler 200 has a one quarter-wave layer (m=0) as acoustic decoupling layer 131. Embodiments of acoustic coupler 200 in which acoustic decoupling layer 131 is a one quarter wave layers couple modulated electrical signal $S_M$ from inputs 26, 28 to outputs 32, 34 with optimum signal integrity.

In some embodiments, acoustic decoupling layer 131 is formed by spin coating a liquid precursor for the acoustic decoupling material over electrode 114. An acoustic decoupling layer formed by spin coating will typically have regions of different thickness due to the contouring of the surface coated by the acoustic decoupling material. In such embodiments, the thickness of acoustic decoupling layer 131 is the thickness of the portion of the acoustic decoupling layer located between electrode 114 and acoustically-resonant electrical insulator 216.

Many materials have acoustic impedances in the range stated above and can be applied in layers of uniform thickness in the thickness ranges stated above. Moreover, many materials are additionally electrically insulating and have high breakdown fields. Such materials are therefore potentially suitable for use as the acoustic decoupling material of acoustic decoupling layer 131. However, the acoustic decoupling material must also be capable of withstanding the high temperatures of the fabrication operations performed after acoustic decoupling layer 131 has been deposited to form acoustic decoupler 130. In practical embodiments of acoustic coupler 200, acoustically-resonant electrical insulator 216, electrodes 122, 124, and piezoelectric layer 126 are deposited by sputtering after the acoustic decoupling material has been deposited. Temperatures as high as 400° C. are reached during these deposition processes. Thus, a material that remains stable at such temperatures is used as the acoustic decoupling material.

Typical acoustic decoupling materials have a very high acoustic attenuation per unit length compared with the materials of FBARs 110 and 120 and acoustically-resonant electrical insulator 216. However, since the acoustic decoupling layer 131 is typically less than 1 μm thick, the acoustic attenuation introduced by acoustic decoupling layer 131 of acoustic decoupling material is typically negligible.

In one embodiment, a polyimide is used as the acoustic decoupling material of acoustic decoupling layer 131. Polyimide is sold under the trademark Kapton® by E. I. du Pont de Nemours and Company. In such embodiment, acoustic decoupler 130 is provided by acoustic decoupling layer 131 of polyimide applied to electrode 114 by spin coating. Polyimide has an acoustic impedance of about 4 Mrayl and a breakdown field of about 165 kV/mm.

In another embodiment, a poly(para-xylylene) is used as the acoustic decoupling material of acoustic decoupling layer 131. In such embodiment, acoustic decoupler 130 is provided by acoustic decoupling layer 131 of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl and a breakdown field of about 275 kV/mm.

In another embodiment, a crosslinked polyphenylene polymer is used as the acoustic decoupling material of acoustic decoupling layer 131. In such embodiment, acoustic decoupler 130 is provided by acoustic decoupling layer 131 of the crosslinked polyphenylene polymer the precursor solution for which is applied to electrode 114 by spin coating. Crosslinked polyphenylene polymers have been developed as low dielectric constant dielectric materials for use in integrated circuits and consequently remain stable at the high temperatures to which the acoustic decoupling material is subject during the subsequent fabrication of acoustically-resonant electrical insulator 216 and FBAR 120. Crosslinked polyphenylene polymers have a calculated acoustic impedance of about 2 Mrayl. This acoustic impedance is in the range of acoustic impedances that provides acoustic coupler 200 with a pass bandwidth sufficient for operation at data rates of over 100 Mbit/s.

Precursor solutions containing various oligomers that polymerize to form respective crosslinked polyphenylene polymers are sold by The Dow Chemical Company, Midland, Mich., under the registered trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl. This crosslinked polyphenylene polymer has a breakdown field of about 400 kV/mm.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., Development of Low-Dielectric Constant Polymer for the Fabrication of Integrated Circuit Interconnect, 12 ADVANCED MATERIALS, 1769 (2000), also incorporated by reference. Compared with polyimide, crosslinked polyphenylene polymers are lower in acoustic impedance, lower in acoustic attenuation, lower in dielectric constant and higher in breakdown field. Moreover, a spun-on layer of the precursor solution is capable of producing a high-quality film of the crosslinked polyphenylene polymer with a thickness of the order of 200 nm, which is a typical thickness of acoustic decoupling layer 131.

In an alternative embodiment, the acoustic decoupling material of acoustic decoupling layer 131 providing acoustic decoupler 130 is a material whose acoustic impedance is substantially greater than that of the materials of FBARs 110 and 120 and acoustically-resonant electrical insulator 216. No materials having this property are known at this time, but such materials may become available in future, or lower acoustic impedance FBAR materials may become available in future. The thickness of a quarter-wave layer of such high acoustic impedance acoustic decoupling material is as described above.

Acoustic decoupling layer 131 and acoustic decoupling layer 231 are described above as being quarter-wave layers of the same acoustic decoupling material. However, acoustic decoupling layer 131 and acoustic decoupling layer 231 may alternatively be quarter-wave layers of different acoustic decoupling materials.

Figure 6B:
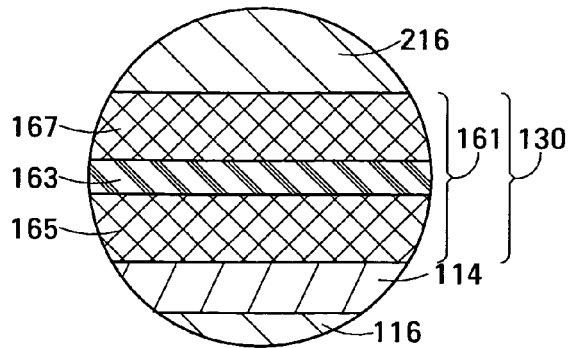
FIG. 6B is an enlarged view of the portion marked 6A in FIG. 5B showing a second embodiment of the acoustic decoupler.

FIG. 6B is an enlarged view of the portion marked 6A in FIG. 5B showing a second embodiment of first acoustic decoupler 130. In the embodiment shown in FIG. 6B, first acoustic decoupler 130 is composed of an acoustic Bragg structure 161 located between electrode 114 and acoustically-resonant electrical insulator 216 and second acoustic decoupler 230 is composed of an acoustic Bragg structure (not shown) located between acoustically-resonant electrical insulator 216 and electrode 122.

Acoustic Bragg structure 161 constituting first acoustic decoupler 130 will now be described in detail. The following description of first acoustic decoupler 130 also applies to second acoustic decoupler 230, so acoustic decoupler 230 will not be separately described. Acoustic Bragg structure 161 comprises a low acoustic impedance Bragg element 163 located between high acoustic impedance Bragg elements 165 and 167. The electrical isolation provided by acoustically-resonant electrical insulator 216 allows Bragg structure 161 to comprise all electrically-conducting Bragg elements. However, an embodiment of Bragg structure 161 in which at least one of the Bragg elements 163, 165 and 167 comprises a layer of material having a high electrical resistivity, a low dielectric permittivity and a high breakdown field increases the breakdown voltage of acoustic coupler 200.

Each of the Bragg elements 163, 165 and 167 is a quarter-wave layer. Low acoustic impedance Bragg element 163 is a quarter-wave layer of a low acoustic impedance material whereas high acoustic impedance Bragg elements 165 and 167 are each a quarter-wave layer of high acoustic impedance material. The acoustic impedances of the materials of the Bragg elements are characterized as "low" and "high" with respect to one another and with respect to the acoustic impedance of the piezoelectric material of piezoelectric elements 116 and 126.

In one embodiment, low acoustic impedance Bragg element 163 is a quarter-wave layer of silicon dioxide ($SiO_2$), which has an acoustic impedance of about 13 Mrayl, and each of the high acoustic impedance Bragg elements 165 and 167 is a quarter-wave layer of the same material as electrodes 114 and 122, respectively, e.g., molybdenum, which has an acoustic impedance of about 63 Mrayl. Using the same material for high acoustic impedance Bragg element 165 and electrode 114 of FBAR 110 allows high acoustic impedance Bragg element 165 additionally to serve as electrode 114.

In an example, high acoustic impedance Bragg elements 165 and 167 are one quarter-wave layers of molybdenum, and low acoustic impedance Bragg element 163 is a one quarter-wave layer of $SiO_2$. In an embodiment in which the frequency of carrier signal $S_C$ is about 1.9 MHz, molybdenum high acoustic impedance Bragg elements 165 and 167 have a thickness of about 820 nm and $SiO_2$ low acoustic impedance Bragg element 163 has a thickness of about 260 nm.

On example of an alternative material for low acoustic impedance Bragg element 163 is a crosslinked polyphenylene polymer such as the above-mentioned crosslinked polyphenylene polymer made from a precursor solution sold under the registered trademark SiLK by Dow Chemical Co. Other examples of alternative materials for low acoustic impedance Bragg element 163 include zirconium oxide ($ZrO_2$), hafnium oxide (HfO), yttrium aluminum garnet (YAG), titanium dioxide ($TiO_2$) and various glasses. Alternative materials for high impedance Bragg elements 165 and 167 include such metals as titanium (Ti), niobium (Nb), ruthenium (Ru) and tungsten (W).

In the example just described, only one of the Bragg elements 163, 165 and 167 is insulating, and the breakdown voltage of acoustic coupler 200, and, hence, of acoustic galvanic isolator 10, is determined by the thickness of low acoustic impedance Bragg element 163, the breakdown field of the material of low acoustic impedance Bragg element 163, the thickness of acoustically-resonant electrical insulator 216 and the breakdown field of the material of acoustically-resonant electrical insulator 216.

The breakdown voltage of acoustic coupler 200 can be increased by making all the Bragg elements 163, 165 and 167 constituting Bragg structure 161 of electrically-insulating material. In an exemplary embodiment, high acoustic impedance Bragg elements 163 and 167 are each a quarter-wave layer of silicon dioxide and low impedance Bragg element 165 is a quarter-wave layer of a crosslinked polyphenylene polymer, such as the above-mentioned crosslinked polyphenylene polymer made from a precursor solution sold under the registered trademark SiLK by Dow Chemical Co. However, silicon dioxide has a relatively low breakdown field of about 30 kV/mm, and a quarter-wave layer of a typical crosslinked polyphenylene polymer is relatively thin due to the relatively low velocity of sound of this material. In another all-insulating embodiment of Bragg structure 161 having a substantially greater breakdown voltage, high acoustic impedance Bragg elements 163 and 167 are each a quarter-wave layer of aluminum oxide ($Al_2O_3$) and low impedance Bragg element 165 is a quarter-wave layer of silicon dioxide. Aluminum oxide has an acoustic impedance of about 44 Mrayl and a breakdown field of several hundred kilovolts/mm. Additionally, the velocity of sound in aluminum oxide is about seven times higher than in a typical crosslinked polyphenylene polymer. A given voltage applied across two quarter-wave layers of aluminum oxide and a quarter wave layer of silicon dioxide results in a much lower electric field than when applied across two quarter-wave layers of silicon dioxide and one quarter-wave layer of a crosslinked polyphenylene polymer.

Examples of alternative electrically-insulating materials for Bragg elements 163, 165 and 167 include zirconium oxide ($ZrO_2$), hafnium oxide (HfO), yttrium aluminum garnet (YAG), titanium dioxide ($TiO_2$) and various glasses. The above examples are listed in an approximate order of descending acoustic impedance. Any of the examples may be used as the material of the high acoustic impedance Bragg layers 165, 167 provided a material having a lower acoustic impedance is used as the material of the low acoustic impedance Bragg layer 163.

In embodiments of acoustic decoupler 130 in which the acoustic impedance difference between high acoustic impedance Bragg elements 165 and 167 and low acoustic impedance Bragg element 163 is relatively low, Bragg structure 161 may be composed of more than one (n) low acoustic impedance Bragg element interleaved with a corresponding number (n+1) of high acoustic impedance Bragg elements. For example, Bragg structure 161 may be composed of two low acoustic impedance Bragg elements interleaved with three high acoustic impedance Bragg elements. While none of the Bragg elements need be electrically insulating, a higher breakdown voltage is obtained when one or more of the Bragg elements is electrically insulating.

Figure 7:
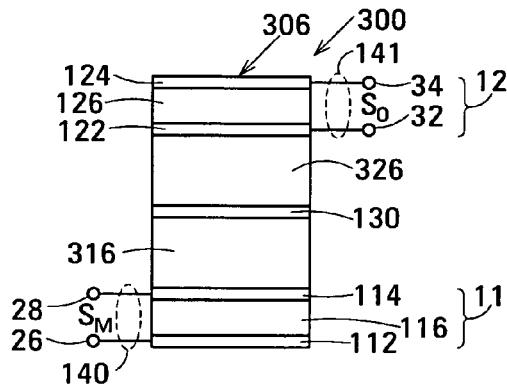
FIG. 7 is a schematic diagram showing an example of an acoustic coupler in accordance with a second embodiment of the invention that may be used as the electrically-isolating acoustic coupler of the acoustic galvanic isolator shown in FIG. 1.
Figure 8A:
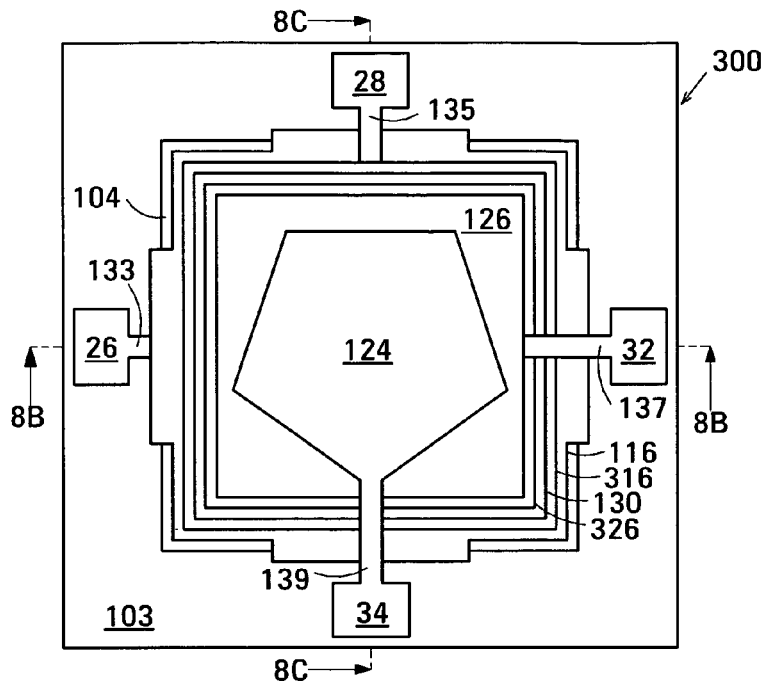
FIG. 8A is a plan view showing a practical example of the acoustic coupler shown in FIG. 7.
Figure 8B:
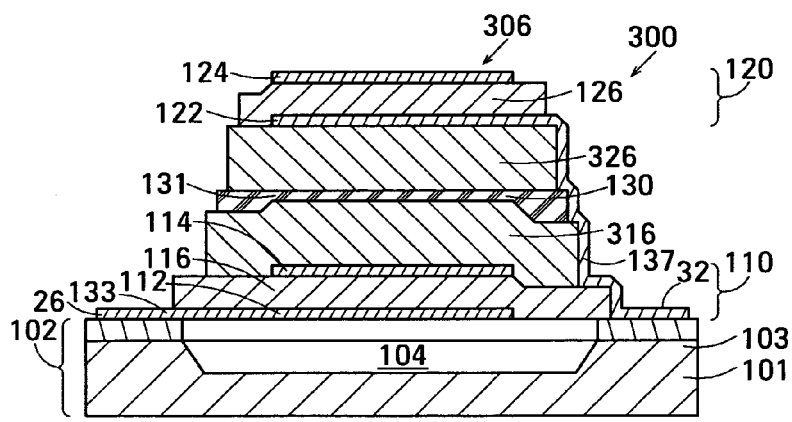
FIGS. 8B and 8C are cross-sectional views along section lines 8B-8B and 8C-8C, respectively, shown in FIG. 8A.
Figure 8C:
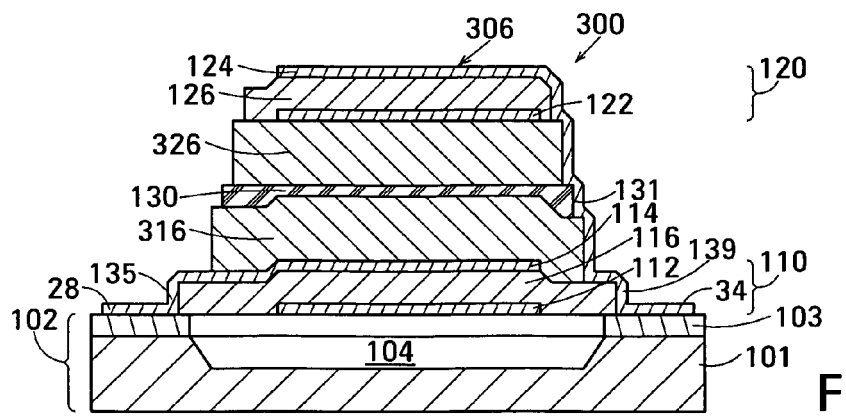

FIG. 7 is a schematic diagram showing an example of an acoustic coupler 300 in accordance with a second embodiment of the invention. FIG. 8A is a plan view showing a practical example of acoustic coupler 300 and FIGS. 8B and 8C are cross-sectional views along section lines 8B-8B and 8C-8C, respectively, shown in FIG. 8A. The same reference numerals are used to denote the elements of acoustic coupler 300 in FIG. 7 and in FIGS. 8A-8C.

Acoustic coupler 300 comprises an insulated stacked bulk acoustic resonator (IDSBAR) 306 in accordance with a second IDSBAR embodiment. In its simplest form, an IDSBAR in accordance with the second IDSBAR embodiment has a first half-wave acoustically-resonant electrical insulator, a single acoustic decoupler and a second half-wave acoustically-resonant electrical insulator located between its constituent FBARs. IDSBAR 306 in accordance with the second IDSBAR embodiment gives acoustic coupler 300 a substantially greater breakdown voltage than acoustic coupler 100 described above with reference to FIG. 2 and acoustic coupler 200 described above with reference to FIGS. 3 and 5A-5C. In the example shown, acoustic coupler 300 additionally comprises inputs 26, 28, outputs 32, 34, an electrical circuit 140 that connects IDSBAR 306 to inputs 26, 28 and an electrical circuit 141 that connects IDSBAR 306 to outputs 32, 34.

When used as electrically-isolating acoustic coupler 16 in acoustic galvanic isolator 10 shown in FIG. 1, acoustic coupler 300 acoustically couples modulated electrical signal $S_M$ from inputs 26, 28 to outputs 32, 34 while providing electrical isolation between inputs 26, 28 and outputs 32, 34. Thus, acoustic coupler 300 effectively galvanically isolates output terminals 36, 38 from input terminals 22, 24, and allows the output terminals to differ in voltage from the input terminals by a voltage up to its specified breakdown voltage.

The exemplary embodiment of IDSBAR 306 shown in FIG. 7 comprises a lower film bulk acoustic resonator (FBAR) 110, an upper film bulk acoustic resonator 120 stacked on FBAR 110 and, located in order between lower FBAR 110 and upper FBAR 120, a first half-wave acoustically-resonant electrical insulator 316, acoustic decoupler 130 and a second half-wave acoustically-resonant electrical insulator 326. The half-wave acoustically-resonant electrical insulators provide additional electrical insulation between inputs 26, 28 and outputs 32, 34 without impairing the signal integrity of the modulated electrical signal $S_M$ acoustically coupled from inputs 26, 28 to outputs 32, 34. Moreover, half-wave acoustically-resonant electrical insulators 316, 326 are two in number and are twice as thick as acoustically-resonant electrical insulator 216 described above with reference to FIGS. 3 and 5A-5C and therefore collectively provide approximately four times the electrical isolation provided by quarter-wave acoustically-resonant electrical insulator 216. As a result, embodiments of acoustic coupler 300 have a greater breakdown voltage between inputs 26, 28 and outputs 32, 34 than otherwise similar embodiments of acoustic coupler 200 described above with reference to FIGS. 3 and 5A-5C.

In the exemplary embodiment of acoustic coupler 300 shown in FIGS. 7 and 8A-8C, IDSBAR 306 comprises lower film bulk acoustic resonator (FBAR) 110, upper film bulk acoustic resonator 120 stacked on FBAR 110 and, between lower FBAR 110 and upper FBAR 120, in order, half-wave acoustically-resonant electrical insulator 316, acoustic decoupler 130 and half-wave acoustically-resonant electrical insulator 326. Other embodiments of IDSBAR 306 comprise an even number (2n) of half-wave acoustically-resonant electrical insulators interleaved with a corresponding number (2n−1) of acoustic decouplers located between the respective FBARs.

FBARs 110 and 120, acoustic decoupler 130, electrical circuits 140 and 141 and substrate 102 are described above with reference to FIGS. 3 and 5A-5C and will not be described again here. The exemplary embodiments of acoustic decoupler 130 described above with reference to FIGS. 6A and 6B may be used to provide acoustic decoupler 130.

Half-wave acoustically-resonant electrical insulator 316 will now be described. The following description also applies to half-wave acoustically-resonant electrical insulator 326, so half-wave acoustically-resonant electrical insulator 326 will not be individually described. Acoustically-resonant electrical insulator 316 is a half-wave layer of electrically-insulating material that is nominally matched in acoustic impedance to FBARs 110 and 120. Embodiments in which half-wave acoustically-resonant electrical insulator 316 is a one half-wave layer typically couple modulated electrical signal $S_M$ from inputs 26, 28 to outputs 32, 34 with optimum signal integrity.

At the center frequency of acoustic coupler 300, half-wave acoustically-resonant electrical insulator 316 and half-wave acoustically-resonant electrical insulator 326 are acoustically transparent. Half-wave acoustically-resonant electrical insulator 316 couples the acoustic signal generated by FBAR 110 to acoustic decoupler 130 and half-wave acoustically-resonant electrical insulator 326 couples the acoustic signal transmitted by acoustic decoupler 130 to FBAR 120. Thus, IDSBAR 306 has signal coupling characteristics similar to those of DSBAR 106 described above with reference to: FIGS. 3 and 5A-5C. Additionally, half-wave acoustically-resonant electrical insulators 316 and 326 electrically insulate FBAR 120 from FBAR 110. Acoustic decoupler 130 typically provides additional electrical insulation as described above. Thus, acoustic coupler 300 effectively couples the modulated electrical signal $S_M$ from inputs 26, 28 to outputs 32, 34 but electrically isolates outputs 32, 34 from inputs 26, 28.

The materials described above with reference to FIGS. 3 and 5A-5C as being suitable for use as quarter-wave acoustically-resonant electrical insulator 216 are suitable for use as half-wave acoustically-resonant electrical insulators 316 and 326. The materials of half-wave acoustically-resonant electrical insulators 316 and 326 will therefore not be further described.

Half-wave acoustically-resonant electrical insulator 316 is twice as thick as above-described quarter-wave acoustically-resonant electrical insulator 216, and two half-wave acoustically-resonant electrical insulators 316 and 326 separate FBAR 120 from FBAR 110. As a result, a given voltage between inputs 26, 28 and outputs 32, 34 produces a much lower electric field when applied across half-wave acoustically-resonant electrical insulators 316 and 326 and acoustic decoupler 130 than when applied across acoustic decoupler 130 in the embodiment of acoustic coupler 100 shown in FIG. 2 or than when applied across acoustic decouplers 130 and 230 and quarter-wave acoustically-resonant electrical insulator 216 in the embodiment of acoustic coupler 200 shown in FIG. 3. Consequently, acoustic coupler 300 typically has a substantially greater breakdown voltage than acoustic coupler 100 shown in FIG. 2 and than acoustic coupler 200 shown in FIG. 3.

Thousands of acoustic galvanic isolators similar to acoustic galvanic isolator 10 are fabricated at a time by wafer-scale fabrication. Such wafer-scale fabrication makes the acoustic galvanic isolators inexpensive to fabricate. The wafer is selectively etched to define a cavity in the location of the electrically-isolating acoustic coupler 16 of each acoustic galvanic isolator to be fabricated on the wafer. The cavities are filled with sacrificial material and the surface of the wafer is planarized. The local oscillator 12, modulator 14 and demodulator 18 of each acoustic galvanic isolator to be fabricated on the wafer are fabricated in and on the surface of the wafer using conventional semiconductor fabrication processing. The fabricated circuit elements are then covered with a protective layer. Exemplary materials for the protective layer are aluminum nitride and silicon nitride.

Embodiments of acoustic coupler 200 described above with reference to FIGS. 5A-5C are then fabricated by sequentially depositing and patterning the following layers: a first layer of electrode material, a first layer of piezoelectric material, a second layer of electrode material, a first layer of acoustic decoupling material or the layers of a first acoustic Bragg structure, a quarter-wave layer of electrically-insulating material, a second layer of acoustic decoupling material, a third layer of electrode material, a second layer of piezoelectric material and a fourth layer of electrode material. These layers form the IDSBAR and the electrical circuits of each acoustic coupler. The electrical circuits additionally connect the ISBAR to exposed connection points on modulator 14 and demodulator 18.

Embodiments of acoustic coupler 300 described above with reference to FIGS. 8A-8C are fabricated by sequentially depositing and patterning the following layers: a first layer of electrode material, a first layer of piezoelectric material, a second layer of electrode material, a first half-wave layer of electrically-insulating material, a layer of acoustic decoupling material or the layers of an acoustic Bragg structure, a second half-wave layer of electrically-insulating material, a third layer of electrode material, a second layer of piezoelectric material and a fourth layer of electrode material. These layers form the IDSBAR and the electrical circuits of each acoustic coupler. The electrical circuits additionally connect the ISBAR to exposed connection points on modulator 14 and demodulator 18 are each deposited and patterned.

After the acoustic decouplers have been fabricated, the sacrificial material is removed to leave each constituent IDSBAR over its respective cavity. Access holes (not shown) provide access to the sacrificial material to facilitate removal. The protective material is then removed from the fabricated circuit elements. The substrate is then divided into individual acoustic galvanic isolators each similar to acoustic galvanic isolator 10. An exemplary process that can be used to fabricate a DSBAR is described in more detail in United States patent application publication no. 2005 0140 466, assigned to the assignee of this disclosure and incorporated by reference, and can be adapted to fabricate IDSBARs of the acoustic galvanic isolators described above.

Alternatively, acoustic couplers 200 or 300 are fabricated on a different wafer from that on which local oscillators 12, modulators 14 and demodulators 18 are fabricated. In this case, the acoustic galvanic isolators may be made by using a wafer bonding process to join the respective wafers to form a structure similar to that described by John D. Larson III et al. with reference to FIGS. 8A-8E of United States patent application publication No. 2005 0 093 659, assigned to the assignee of this disclosure and incorporated by reference.

In a further alternative, local oscillators 12, modulators 14 and acoustic couplers 200 or 300 are fabricated on one wafer and corresponding demodulators 18 are fabricated on the other wafer. The wafers are then bonded together as just described to form the acoustic galvanic isolators. Alternatively, the local oscillators 12 and modulators 14 are fabricated on one wafer and the acoustic couplers 200 or 300 and demodulators 18 are fabricated on the other wafer. The wafers are then bonded together as just described to form the acoustic galvanic isolators.

In another alternative suitable for use in applications in which the acoustic galvanic isolators are specified to have a large breakdown voltage between input terminals 22, 24 and output terminals 36, 38, multiple input circuits each comprising an instance of local oscillator 12 and an instance of modulator 14 and multiple output circuits each comprising an instance of demodulator 18 are fabricated in and on a semiconductor wafer. The wafer is then singulated into individual semiconductor chips each embodying a single input circuit or a single output circuit. The electrically-isolating acoustic coupler 16 of each acoustic galvanic isolator is fabricated suspended over a cavity defined in a ceramic wafer having conductive traces located on its major surface. For each acoustic galvanic isolator fabricated on the wafer, one semiconductor chip embodying an input circuit and one semiconductor chip embodying an output circuit are mounted on the ceramic wafer in electrical contact with the conductive traces. For example, the semiconductor chips may be mounted on the ceramic wafer by ball bonding or flip-chip bonding. Ceramic wafers with attached semiconductor chips can also be used in the above-described two wafer structure.

In an exemplary embodiment of acoustic galvanic isolator 10 operating at a carrier frequency of about 1.9 GHz, the material of electrodes 112, 114, 122 and 124 is molybdenum. Each of the electrodes has a thickness of about 300 nm and is pentagonal in shape with an area of about 12,000 square μm. A different area gives a different characteristic impedance. The non-parallel sides of the electrodes minimize lateral modes in FBARs 110 and 120 as described by Larson III et al. in U.S. Pat. No. 6,215,375, assigned to the assignee of this disclosure and incorporated by reference. The metal layers in which electrodes 112, 114, 122, and 24 are defined are patterned such that, in respective planes parallel to the major surface of the wafer, electrodes 112 and 114 of FBAR 110 have the same shape, size, orientation and position, and electrodes 122 and 124 of FBAR 120 have the same shape, size, orientation and position. Typically, electrodes 114 and 122 additionally have the same shape, size, orientation and position. Alternative electrode materials include such metals as tungsten, niobium and titanium. The electrodes may have a multi-layer structure.

The material of piezoelectric elements 116 and 126 is aluminum nitride. Each piezoelectric element has a thickness of about 1.4 μm. Alternative piezoelectric materials include zinc oxide, cadmium sulfide and poled ferroelectric materials such as perovskite ferroelectric materials, including lead zirconium titanate (PZT), lead metaniobate and barium titanate.

The acoustic decoupling material constituting acoustic decoupling layer 131 in the embodiment of acoustic decoupler 130 shown in FIG. 6A is polyimide, parylene or a crosslinked polyphenylene polymer, as described above. A one quarter-wave layer of polyimide is about 100 nm thick whereas a one quarter-wave layer of crosslinked polyphenylene polymer is about 190 nm thick. As noted above, the acoustic decoupling layer 131 may have a thickness of three, five or more times the above-specified one quarter-wave layer thickness. Suitable materials for use in embodiments in which acoustic decoupler 130 is embodied as an acoustic Bragg structure are described above.

In embodiments of acoustic coupler 200 described above with reference to FIGS. 5A-5C, the material of acoustically-resonant electrical insulator 216 is aluminum nitride. Acoustically-resonant electrical insulator 216 has a thickness of about 1.4 μm. Alternative materials include aluminum oxide ($Al_2O_3$) and non-piezoelectric aluminum nitride (AlN). Exemplary acoustic decoupling material for the second acoustic decoupling layer providing the embodiments of second acoustic decoupler 230 include polyimide, parylene or a crosslinked polyphenylene polymer, as described above.

In embodiments of acoustic coupler 300 described above with reference to FIGS. 8A-8C, the material of half-wave acoustically-resonant electrical insulators 316 and 326 is aluminum nitride. Each half-wave acoustically-resonant electrical insulator has a thickness of about 2.8 μm. Alternative materials include aluminum oxide ($Al_2O_3$) and non-piezoelectric aluminum nitride (AlN).

In the above-described example of acoustic galvanic isolator 10, inputs 26, 28 are connected to FBAR 110 and outputs 32, 34 are connected to FBAR 120. In other embodiments, the direction in which the acoustic signal flows is reversed, and outputs 32, 34 are connected to FBAR 110 and inputs 26, 28 are connected to FBAR 120.

Figure 9:
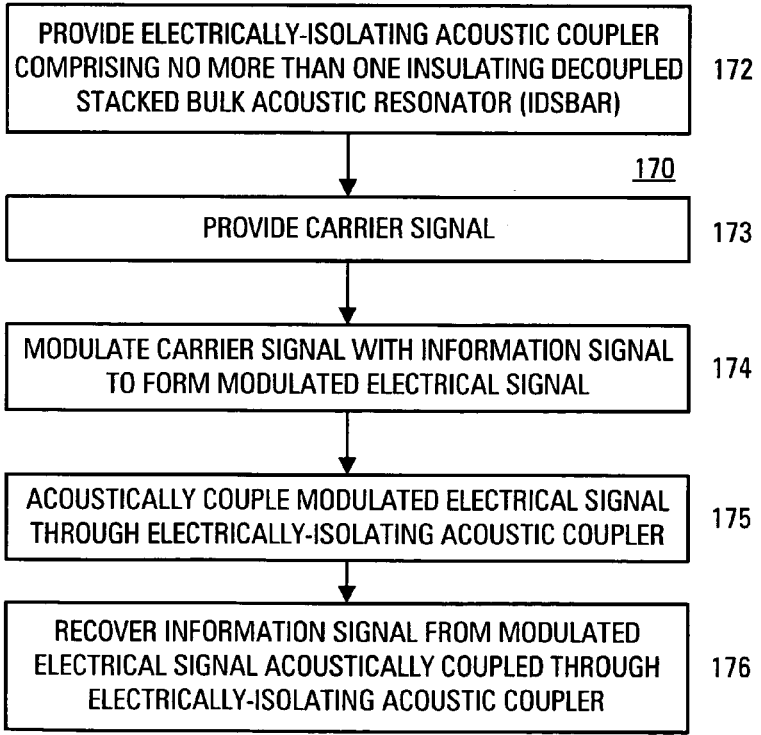
FIG. 9 is a flow chart showing an example of a method in accordance with an embodiment of the invention for galvanically isolating an information signal.

FIG. 9 is a flow chart showing an example of a method 170 in accordance with an embodiment of the invention for galvanically isolating an information signal. In block 172, an electrically-isolating acoustic coupler is provided. The electrically-isolating acoustic coupler comprises no more than one decoupled stacked bulk acoustic resonator comprising an acoustically-resonant electrical insulator. In block 173, a carrier signal is provided. In block 174, the carrier signal is modulated with the information signal to form a modulated electrical signal. In block 175, the modulated electrical signal is acoustically coupled through the electrically-isolating acoustic coupler. In block 176, the information signal is recovered from the modulated electrical signal acoustically coupled though the acoustic coupler.

This disclosure describes the invention in detail using illustrative embodiments. However, the invention defined by the appended claims is not limited to the precise embodiments described.

I claim:

1. An acoustic galvanic isolator, comprising:
   a carrier signal source;
   a modulator connected to receive an information signal and the carrier signal;
   a demodulator; and
   connected between the modulator and the demodulator, an electrically-isolating acoustic coupler comprising a single insulating decoupled stacked bulk acoustic resonator (IDSBAR), the IDSBAR comprising an acoustically-resonant electrical insulator.

2. The acoustic galvanic isolator of claim 1, in which:
   the IDSBAR additionally comprises a first film bulk acoustic resonator (FBAR), a second FBAR, and a first acoustic decoupler and a second acoustic decoupler between the FBARs; and
   the acoustically-resonant electrical insulator comprises a quarter-wave layer of electrically-insulating material and is located between the first acoustic decoupler and the second acoustic coupler.

3. The acoustic galvanic isolator of claim 1, in which:
   the acoustically-resonant electrical insulator is a first acoustically-resonant electrical insulator;

the IDSBAR additionally comprises a first film bulk acoustic resonator (FBAR), a second FBAR, and, between the FBARs, in order, the first acoustically-resonant electrical insulator, an acoustic decoupler and a second acoustically-resonant electrical insulator; and each acoustically-resonant electrical insulator is a half-wave acoustically-resonant electrical insulator and comprises a half-wave layer of electrically-insulating material.

4. The acoustic galvanic isolator of claim 1, in which the acoustically-resonant electrical insulator comprises a layer of electrically-insulating material.

5. The acoustic galvanic isolator of claim 4, in which the electrically-insulating material comprises one of aluminum nitride and aluminum oxide.

6. The acoustic galvanic isolator of claim 1, in which:
the IDSBAR additionally comprises a first film bulk acoustic resonator (FBAR), a second FBAR, and an acoustic decoupler; and
the acoustically-resonant electrical insulator and the acoustic decoupler are juxtaposed between the FBARs.

7. The acoustic galvanic isolator of claim 6, in which the acoustically-resonant electrical insulator is matched in acoustic impedance to the FBARs.

8. The acoustic galvanic isolator of claim 6, in which the acoustically-resonant electrical insulator differs in acoustic impedance from the FBARs by less than one order of magnitude.

9. The acoustic galvanic isolator of claim 6, in which the acoustic decoupler comprises an acoustic decoupling layer comprising an acoustic decoupling material.

10. The acoustic galvanic isolator of claim 6, in which the acoustic decoupling material differs in acoustic impedance from the FBARs by about one order of magnitude.

11. The acoustic galvanic isolator of claim 6, in which the acoustic decoupler is electrically insulating.

12. The acoustic galvanic isolator of claim 6, in which the acoustic decoupler comprises an acoustic Bragg structure.

13. The acoustic galvanic isolator of claim 12, in which the acoustic Bragg structure comprises one or more low acoustic impedance Bragg elements interleaved with high acoustic impedance Bragg elements; and at least one of the Bragg elements is electrically insulating.

14. The acoustic galvanic isolator of claim 12, in which the acoustic Bragg structure comprises one or more layers of crosslinked polyphenylene polymer interleaved with layers of silicon dioxide.

15. The acoustic galvanic isolator of claim 6, in which the IDSBAR additionally comprises an additional acoustically-resonant electrical insulator and an additional acoustic decoupler between the FBARs.

16. The acoustic galvanic isolator of claim 1, additionally comprising an additional acoustically-resonant electrical insulator.

17. A method for galvanically isolating an information signal, the method comprising:
providing an electrically-isolating acoustic coupler comprising a single insulating decoupled stacked bulk acoustic resonator (IDSBAR), the IDSBAR comprising an acoustically-resonant electrical insulator;
providing a carrier signal;
modulating the carrier signal with the information signal to form a modulated electrical signal;
acoustically coupling the modulated electrical signal through the electrically-isolating acoustic coupler; and
recovering the information signal from the modulated electrical signal acoustically coupled through the electrically-isolating acoustic coupler.

18. The method of claim 17, in which:
the IDSBAR additionally comprises a first film bulk acoustic resonator (FBAR), a second FBAR stacked on the first FBAR, and a first acoustic decoupler and a second acoustic decoupler located between the FBARs; and
the acoustically-resonant electrical insulator comprises a quarter-wave layer of electrically-insulating material and is located between the first acoustic decoupler and the second acoustic decoupler.

19. The method of claim 17, in which:
the acoustically-resonant electrical insulator is a first acoustically-resonant electrical insulator;
the IDSBAR additionally comprises a first film bulk acoustic resonator (FBAR), a second FBAR stacked on the first FBAR, and, between the FBARs, in order, the first acoustically-resonant electrical insulator, an acoustic decoupler and a second acoustically-resonant electrical insulator; and
each acoustically-resonant electrical insulator is a half-wave acoustically-resonant electrical insulator and comprises a half-wave layer of electrically-insulating material.

20. The method of claim 17, in which the acoustically-resonant electrical insulator comprises a layer of electrically-insulating material.

21. The method of claim 20, in which the electrically-insulating material comprises one of aluminum nitride or aluminum oxide.

22. The method of claim 17, in which:
the IDSBAR additionally comprises a first film bulk acoustic resonator (FBAR), a second FBAR and an acoustic decoupler;
the acoustically-resonant electrical insulator and the acoustic decoupler are juxtaposed between the FBARs; and
the coupling comprises:
applying the modulated electrical signal to one of the FBARs, and
receiving the modulated electrical signal from the other of the FBARs.

* * * * *

UNITED STATES PATENT AND TRADEMARK OFFICE
CERTIFICATE OF CORRECTION

PATENT NO. : 7,425,787 B2
APPLICATION NO. : 11/253508
DATED : September 16, 2008
INVENTOR(S) : John D. Larson, III It is certified that error appears in the above-identified patent and that said Letters Patent is hereby corrected as shown below:

Column 21, Line 40, Claim 13, delete "which" and insert -- which: --;

Column 22, Line 44 (Approx.), Claim 22, after "IDSBAR" delete "additionally".

Signed and Sealed this

Twenty-sixth Day of October, 2010

David J. Kappos
*Director of the United States Patent and Trademark Office*